United States Patent [19]

Schutter et al.

[11] Patent Number: 5,382,906
[45] Date of Patent: Jan. 17, 1995

[54] METHOD FOR DETERMINING AN ACTUAL TRIPPING CHARACTERISTIC OF A RELAY

[75] Inventors: Jan Schutter, Untersiggenthal; Martin Wiederkehr, Eiken, both of Switzerland

[73] Assignee: Asea Brown Boveri Ltd., Baden, Switzerland

[21] Appl. No.: 18,260

[22] Filed: Feb. 16, 1993

[30] Foreign Application Priority Data

Mar. 18, 1992 [DE] Germany ............................ 4208613

[51] Int. Cl.$^6$ ............................................ G01R 31/02
[52] U.S. Cl. ................................... 324/418; 324/415
[58] Field of Search ............... 324/418, 422, 423, 415; 340/644; 361/96, 97, 78-80, 85-87

[56] References Cited

FOREIGN PATENT DOCUMENTS 2021790 12/1979 United Kingdom .
2090002 6/1982 United Kingdom .

OTHER PUBLICATIONS

IEEE Transation, vol. PAS-96, No. 4, Jul./Aug. 1977 "An Automated Testing System for Distance Relay".

*Primary Examiner*—Walter E. Snow
*Assistant Examiner*—Jay M. Patidar
*Attorney, Agent, or Firm*—Burns, Doane, Swecker & Mathis

[57] ABSTRACT

The present invention is directed to a method for determining actual tripping characteristics with the aid of a test apparatus in which test parameters are input with the aid of an input unit. The aim is to specify an appropriate method which works particularly quickly and precisely. This can be achieved when a theoretical tripping characteristic of the respective protective relay is stored in the test apparatus. Each measurement point of the actual tripping characteristic is determined on a locating straight line, the starting point for the measurement being a point of intersection of the locating straight line with the theoretical tripping characteristic. In this case, the locating straight line dissects the theoretical tripping characteristic at an angle. The angle is situated in a range from 60° to 120°, 90° being preferred.

8 Claims, 2 Drawing Sheets

METHOD FOR DETERMINING AN ACTUAL TRIPPING CHARACTERISTIC OF A RELAY

FIELD OF THE INVENTION

The invention proceeds from a method for determining actual tripping characteristics.

DISCUSSION OF BACKGROUND

Test apparatuses are known for functional testing and monitoring of the response characteristics and tripping characteristics of differing protective relays, in particular frequency relays, distance relays, directional relays and power relays. Such test apparatuses permit dynamic or static tests using selectable current, voltage and angle or impedance parameters in a wide range. The test apparatuses are designed to be programable, so that the user can himself determine the test sequences if one does not wish to have recourse to existing test programs.

In these known test apparatuses, an external computer can be used in order to undertake calculations of theoretical tripping characteristics and to compare these theoretical characteristics with the measured actual tripping characteristics.

When measuring a tripping characteristic of a protective apparatus, for example a distance relay, in an impedance plane, either the modulus of the impedance is held constant and the angle is varied, or the angle is held constant and the modulus of the impedance is varied. It can happen in this measurement method that the line along which measurement is made—this is frequently a locating straight line— intersects the actual tripping characteristic at a very acute angle, so that no clearly defined points of intersection are produced. Determining the actual tripping characteristic in this area can be performed only comparatively imprecisely, added to which a comparatively long time is required for these measurements carried out with the aid of iteration methods. In a further measurement method, an array of measurement points is laid over the impedance plane. The actual tripping characteristic can be determined to a rough approximation from these very time-consuming measurements.

During the respective measurements, the relay to be tested is decoupled from the power-line and cannot undertake its protective functions. Measurements which are more time-consuming and imprecise unnecessarily lengthen the time during which the protection cannot be fully ready for use.

SUMMARY OF THE INVENTION

Accordingly, one object of this invention is to provide a novel method for determining tripping characteristics which works particularly rapidly and precisely.

The advantages achieved by the invention are to be seen in that the availability of the protective devices to be tested is substantially improved. Furthermore, it is particularly advantageous that it is always precisely defined points of intersection with the tripping characteristic that are determined.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
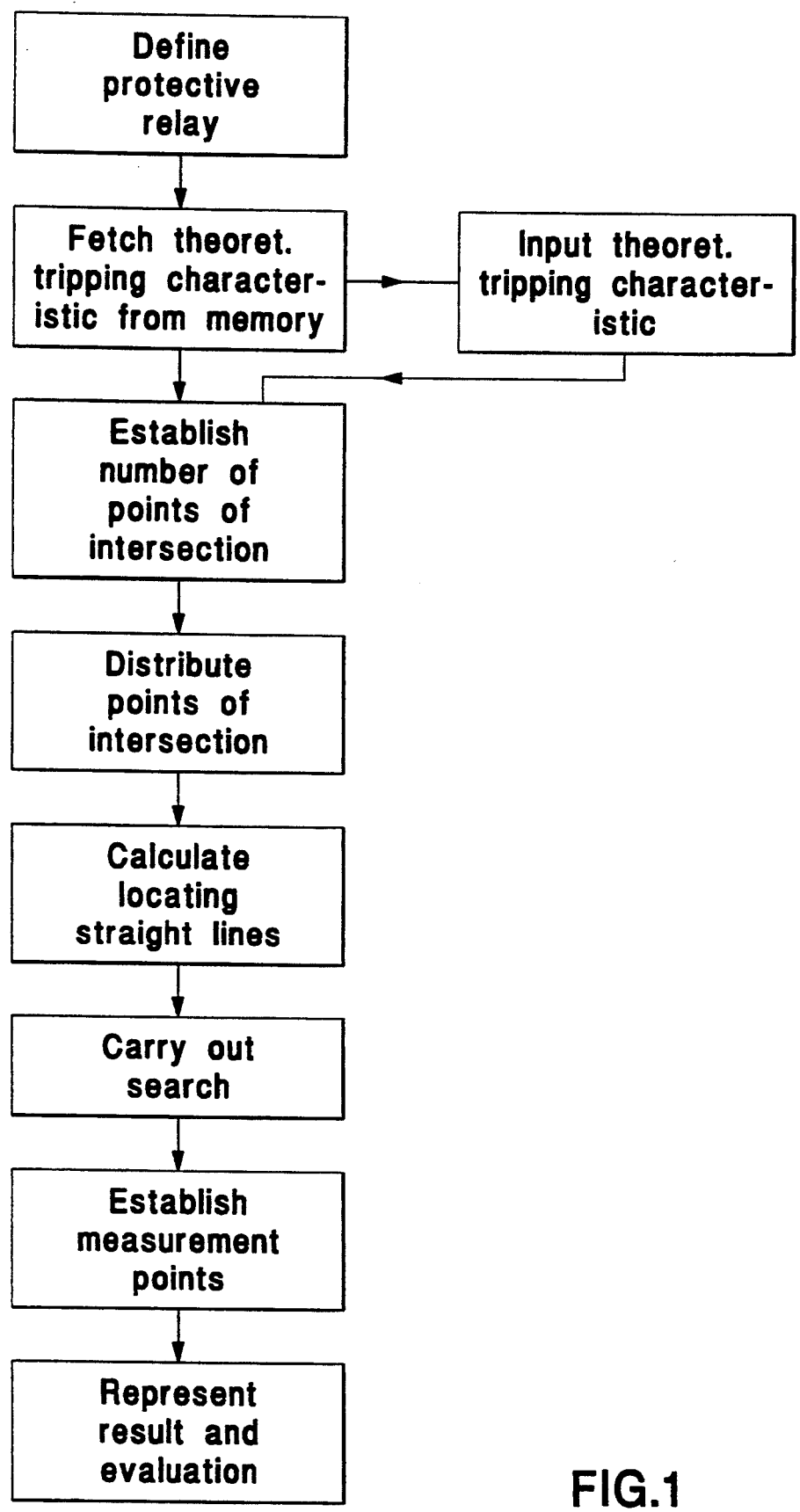
FIG. 1 shows a block diagram of the method according to the invention.

Referring now to the drawings, wherein like reference numerals designate identical or corresponding parts throughout the several views, FIG. 1 shows a block diagram with the most important method steps for determining actual tripping characteristics of protective relays. It is of no significance in this case which type of protective relay is to be tested. One of the known test apparatuses is used for these tests, but is not to be described in more detail here. After the type of the protective relay has firstly been established by means of the test apparatus being used, which is connected to the protective relay, the next step is to fetch the theoretical tripping characteristic from the memory of the test apparatus and, as a rule, to render it visible on a display. If no tripping characteristic is present in the memory for the relevant protective relay, an input unit connected to the test apparatus is used to determine, on the basis of the setting data of the relevant protective relay, a theoretical tripping characteristic, which is thereupon fed in. It is advantageous to use a personal computer as input unit, and its screen as display. As a rule, the theoretical tripping characteristics are visualized on this display.

Subsequently, the number of the points of intersection of a locating straight line with the theoretical tripping characteristic are established. The larger the selected number of these points of intersection, the more precisely can the actual tripping characteristic be determined. If, here, a high precision is demanded, there is also a corresponding rise in the time outlay for carrying out the test. The points of intersection are distributed uniformly on the theoretical tripping curve by the input unit. A computer placed in the input unit is used to calculate at each of the points of intersection a locating straight line which intersects the theoretical tripping characteristic. Thereafter, the actual search is carried out, the points of intersection being used sequentially to determine the measurement points, respectively corresponding to them, on the actual tripping characteristic. Upon conclusion of the tests, the result is represented, preferably on a display. The actual tripping characteristic is calculated and represented on the basis of the measurement points determined. This actual tripping characteristic is subsequently compared to the theoretical tripping characteristic. An evaluation shows whether the tested protective relay reliably fulfils its function in a prescribed range within a prescribed tolerance band. This evaluation can also be carried out automatically.

Figure 2:
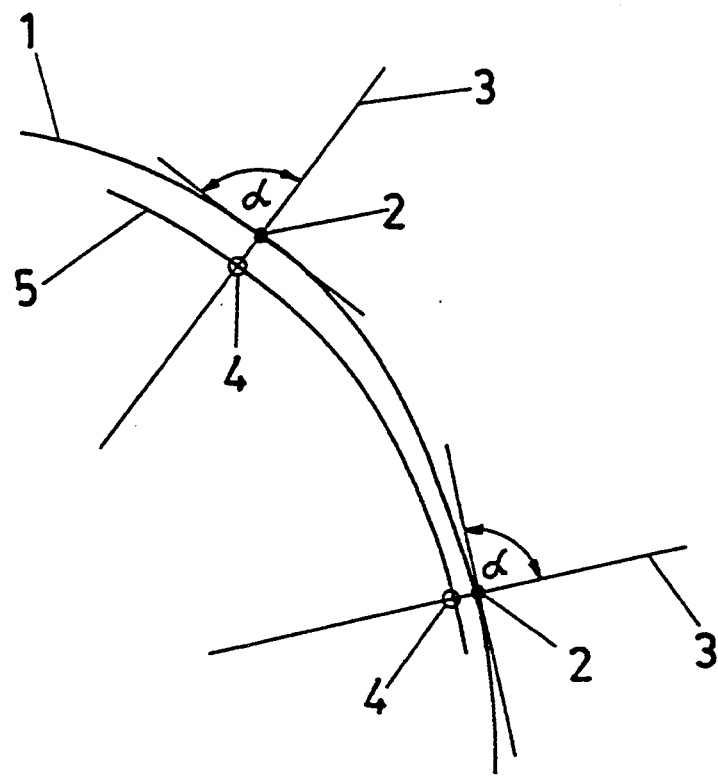
FIG. 2 shows a sketch of a detail.

FIG. 2 shows an extract from an impedance plane of a protective relay with a portion of a theoretical tripping characteristic 1. Represented on this tripping characteristic 1 are two points 2 of intersection which have been established by the input unit. An algorithm implemented in the input unit now calculates locating straight lines 3 which intersect the theoretical tripping characteristic 1 at the respective point 2 of intersection at an angle α. In order to achieve a clearly defined point 2 of intersection, the angle α is selected in a range from approximately 60° to 120°. An angle α of 90° has proved to be particularly advantageous. The search for measurement points 4 which lie on the actual tripping characteristic 5 is now carried out on each of these locating straight lines.

Figure 3:
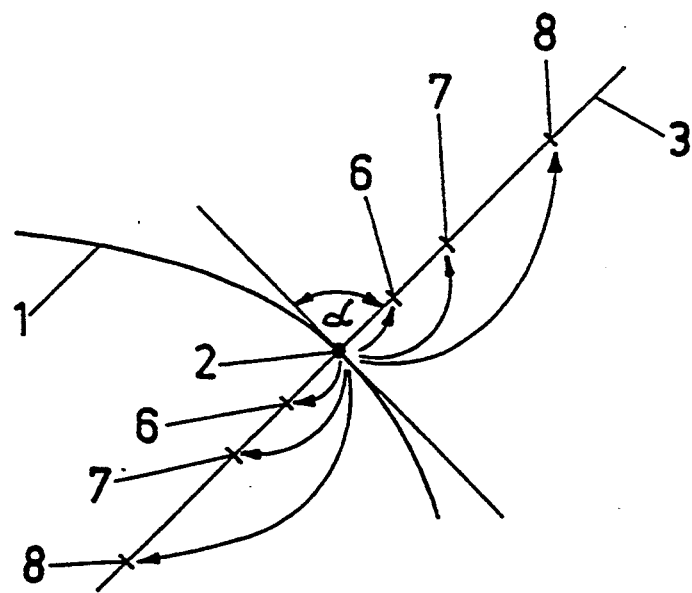
FIG. 3 shows a further sketch of a detail which illustrates method steps.

The procedure in this search is described with the aid of FIG. 3. Starting from the point 2 of intersection of the locating straight line 3 with the theoretical tripping curve 1, a first measurement is carried out at the points 6 on the locating straight line 3 on both sides on the locating straight line 3 with a preselectable deviation. If no tripping of the protective relay is established at the two points 6, it is assumed that no tripping takes place in the area therebetween, and that the measurement limit is therefore not situated in this area. Consequently, a second measurement is carried out with a double deviation at the points 7. If tripping is established at both points 6, it is assumed that tripping takes place in the entire area there between, and that the measurement limit likewise is not situated in this area. A second measurement is carried out at 7 in this case, as well. If the same result is established once again at both points 7 (no tripping twice, or tripping twice), the deviation is doubled once again and measured at the points 8. This expansion of a deviation is either continued until a) the measurement results differ for a pair of points, so that the measurement limit is situated inside the last pair of points, or until b) a prescribed deviation is reached without different measurement results having been established. In case a), the precise measurement limit is now located iteratively between the last pair of points. The measurement limit found then corresponds to a measurement point 4 on the actual tripping characteristic. In case b), measurement is broken off, since the protective relay does not operate satisfactorily in this tripping area, and therefore has to be overhauled or replaced.

Points 4 of measurement are represented FIG. 2, that is to say points at which the protective relay has tripped during the corresponding measurement. These points 4 of measurement are used in order to determine the actual tripping characteristic 5. If, as shown here, the theoretical tripping characteristic and the actual tripping characteristic 5 are situated comparatively close to one another and in the tolerable operating range of the respective protective relay, the evaluation of the results shows that the relevant protective relay is operating satisfactorily, and that it can remain in use and ensure the operational reliability of the power-line area to be protected. The representation of these results on a display facilitates their assessment.

The measurement method described works very quickly and reliably, since unique points 2 of intersection on the theoretical characteristic are determined as starting points for the measurement. The period of time for which the protective relay to be tested has to be put out of operation for the measurement can therefore be kept advantageously short, so that the reduction of the availability of the protective relay to be tested is scarcely of any importance. The entire measurement process can also be fully automated, in order in this way even more quickly to obtain the actual tripping characteristic 5 being sought.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for determining an actual tripping characteristic of a protective relay by means of a test apparatus in which test parameters are input into the test apparatus by means of an input unit, said method comprising the steps of:
   storing a theoretical tripping characteristic of the protective relay in the test apparatus; and
   determining at least one measurement point of the actual tripping characteristic on a locating straight line starting from a point of intersection of the locating straight line with the theoretical tripping characteristic, wherein
   the locating straight line is selected to intersect the theoretical tripping characteristic at an angle which is situated in a range from 60° to 120°.

2. The method as claimed in claim 1, wherein said step of determining further includes steps of;
   starting from a point of intersection, carrying out a first measurement on both sides on the locating straight line with a preselectable deviation;
   thereafter, if no tripping of the protective relay can be established, doubling the deviation and carrying out a second measurement;
   thereafter, if once again no tripping of the protective relay can be established, continuing this process to a prescribed relative deviation, and thereafter breaking off measurement for this point of intersection; and
   once a tripping of the protective relay is established iteratively searching a corresponding measurement point in an area between a last measurement point before said tripping and a second-to-last deviation before said tripping.

3. The method as claimed in claim 1, further comprising the step of:
   inputting the theoretical tripping characteristic of the protective relay either as a whole, or determining the theoretical tripping characteristic in the input unit from setting data of the protective relay and thereafter feeding the theoretical tripping characteristic into the test apparatus.

4. The method as claimed in claim 2, further comprising the steps of:
   uniformly distributing a number of points of intersection, which corresponds to a desired number of measurement points, on the theoretical tripping characteristic, the input unit undertaking this distribution; and
   using the points of intersection sequentially to determine the measurement points.

5. The method as claimed in claim 4, further comprising the step of:
   displaying the theoretical tripping characteristic, the points of intersection and the measurement points on a display assigned to the input unit.

6. The method as claimed in claim 1, further comprising the steps of:
   determining in the input unit the actual tripping characteristic on the basis of the measurement points determined; and
   displaying the actual tripping characteristic on a display assigned to the input unit.

7. The method as claimed in claim 1, further comprising the step of:
   providing a personal computer as the input unit.

8. The method as claimed in claim 1, further comprising the step of: selecting said angle as 90°.

* * * * *